United States Patent
Utsunomiya et al.

(10) Patent No.: US 9,270,231 B2
(45) Date of Patent: Feb. 23, 2016

(54) DISTORTION COMPENSATION APPARATUS, WIRELESS TRANSMISSION APPARATUS, AND DISTORTION COMPENSATION METHOD

(71) Applicant: FUJITSU LIMITED, Kawasaki-shi, Kanagawa (JP)

(72) Inventors: Yuichi Utsunomiya, Kawasaki (JP); Hiroyoshi Ishikawa, Kawasaki (JP); Kazuo Nagatani, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/595,283

(22) Filed: Jan. 13, 2015

(65) Prior Publication Data
US 2015/0236656 A1    Aug. 20, 2015

(30) Foreign Application Priority Data
Feb. 17, 2014    (JP) .................. 2014-027939

(51) Int. Cl.
*H04B 1/04*    (2006.01)
*H03F 1/32*    (2006.01)

(52) U.S. Cl.
CPC ............ *H03F 1/3247* (2013.01); *H04B 1/04* (2013.01); *H04B 1/0475* (2013.01); *H03F 2200/129* (2013.01); *H03F 2201/3215* (2013.01); *H04B 2001/0425* (2013.01); *H04B 2001/0433* (2013.01)

(58) Field of Classification Search
CPC ....... H03F 1/3247; H04B 1/04; H04B 1/0475
USPC .................... 455/91, 114.1, 114.2, 114.3, 126
See application file for complete search history.

(56) References Cited

U.S. PATENT DOCUMENTS

| 5,867,065 A * | 2/1999 | Leyendecker ........ H03F 1/3247 330/149 |
| 2002/0079964 A1* | 6/2002 | Miyatani ............... H03F 1/3247 330/149 |
| 2003/0197558 A1* | 10/2003 | Bauder ................. H03F 1/3247 330/149 |
| 2004/0116083 A1 | 6/2004 | Suzuki et al. |
| 2008/0187035 A1 | 8/2008 | Nakamura et al. |
| 2010/0277236 A1 | 11/2010 | Horiguchi et al. |
| 2012/0098596 A1 | 4/2012 | Nagatani et al. |

FOREIGN PATENT DOCUMENTS

| JP | 2005-065211 | 3/2005 |
| JP | 2012-090158 | 5/2012 |
| JP | 2012-060254 | 3/2013 |
| WO | 2007/046370 | 4/2007 |
| WO | 2009/090825 | 7/2009 |

* cited by examiner

*Primary Examiner* — Tuan Pham
(74) *Attorney, Agent, or Firm* — Fujitsu Patent Center

(57) ABSTRACT

A distortion compensation apparatus that compensates nonlinear distortion of an amplifier that amplifies power of a multi-carrier signal includes a band limiting unit that places a first frequency band limitation on a first signal fed back from the amplifier to output a second signal after the first frequency band limitation, a decision unit that decides a first cutoff frequency of the first frequency band limitation based on a carrier interval of the multi-carrier signal, and an updating unit that updates a distortion compensation coefficient to be used for compensation of the nonlinear distortion, based on an error between the second signal and the multi-carrier signal.

11 Claims, 6 Drawing Sheets

DISTORTION COMPENSATION APPARATUS, WIRELESS TRANSMISSION APPARATUS, AND DISTORTION COMPENSATION METHOD

CROSS-REFERENCE TO RELATED APPLICATION

This application is based upon and claims the benefit of priority of the prior Japanese Patent Application No. 2014-027939, filed on Feb. 17, 2014, the entire contents of which are incorporated herein by reference.

FIELD

The embodiments discussed herein are related to a distortion compensation apparatus, a wireless transmission apparatus, and a distortion compensation method.

BACKGROUND

A wireless transmission apparatus in a wireless communication system includes an amplifier that amplifies the power of a transmission signal. In the wireless transmission apparatus, the amplifier is generally operated in the vicinity of the saturation region of the amplifier to increase the power efficiency of the amplifier. However, if the amplifier is operated in the vicinity of the saturation region, nonlinear distortion increases. Hence, the wireless transmission apparatus includes a distortion compensation apparatus that compensates the nonlinear distortion to suppress the nonlinear distortion and reduce the adjacent channel leakage ratio (ACLR: Adjacent Channel Leakage Ratio).

One of distortion compensation methods used by the distortion compensation apparatus is a "predistortion (hereinafter may be referred to as "PD") method." A PD type distortion compensation apparatus previously multiplies a distortion compensation coefficient of the amplifier, which has an inverse characteristic of nonlinear distortion, by a transmission signal before being input into the amplifier. Accordingly, the linearity of the output of the amplifier is increased to suppress the distortion of the output of the amplifier. A signal after the distortion compensation coefficient was multiplied by the transmission signal may be referred to as the "predistortion signal (PD signal)." Hence, the PD signal is a previously distorted signal in accordance with the inverse characteristic of nonlinear distortion of the amplifier, before being input into the amplifier.

For example, one of known PD type distortion compensation apparatuses includes a table in which a plurality of distortion compensation coefficients is stored, and reads, from the table, a distortion compensation coefficient in accordance with the power of the transmission signal, in other words, the power input into the amplifier. The distortion compensation coefficients stored in the table are sequentially updated in such a manner as to minimize an error between the transmission signal and a signal output and fed back from the amplifier (hereinafter may be referred to as "feedback signal").

Moreover, for example, one of known power amplification systems including the PD type distortion compensation apparatus limits a frequency band of the feedback signal upon updating of the distortion compensation coefficients. In the power amplification system, a passband width of the feedback signal is changed by a band-limiting filter to compensate predetermined lower-order distortion if the passband is a predetermined narrow width, and to compensate predetermined higher-order distortion if the passband is a predetermined wide width.

Related-art examples are described, for example, in Japanese Laid-open Patent Publication No. 2012-090158 and Japanese Laid-open Patent Publication No. 2012-060254.

FIG. 1 is a diagram provided for the description of the problem. If the transmission signal is a multi-carrier signal containing a plurality of signals at different frequencies from one another, when the amplifier is operated in the non-linear region for the multi-carrier signal, inter modulation distortion (Inter Modulation Distortion; hereinafter may be referred to as "IM") may occur. For example, as illustrated in FIG. 1, if a multi-carrier signal containing a signal of a frequency f1 and a signal of a frequency f2 is amplified in the non-linear region, IM3, IM5, and IM7 being respectively third-, fifth-, and seventh-order IMs may occur. As in FIG. 1, these IMs occur at positions at both ends of the bottom of each of the frequencies f1 and f2, and at positions a fixed distance away from the frequencies f1 and f2, on the frequency axis. Here, the distortion compensation apparatus is assumed to be capable of compensating IMs up to IM7. In other words, a frequency band capable of distortion compensation (hereinafter may be referred to as the "distortion compensation band") is assumed to be a band that covers up to IM7.

Here, the amplifier amplifies the transmission signal that has been converted from digital into analog by, for example, a DAC (Digital to Analog Converter; digital-to-analog converter) and then modulated by a quadrature modulator. Moreover, in this case, the feedback signal from the amplifier is demodulated by the quadrature demodulator, converted from analogue to digital by an ADC (Analog to Digital Converter; analog-to-digital converter), and input into the distortion compensation apparatus. The quadrature demodulator includes an analog filter to remove a folded component generated upon frequency conversion with the quadrature demodulator. Moreover, the DAC includes an analog filter to remove an image component generated by an interpolation process performed upon digital-to-analog conversion. The passbands of these analog filters are set according to the distortion compensation band. However, it is difficult to realize an analog filter as an ideal filter. Accordingly, frequency components at ends of the distortion compensation band are also cut off by these analog filters. For example, if the frequency response of the analog filters is one illustrated in FIG. 1, a part of IM7 lying in regions at both ends of the distortion compensation band is cut off. If the part of IM7 lying in the both end regions of the distortion compensation band is cut off, IM7 lying at the bottoms of the signals of the frequencies f1 and f2 is influenced so that the IM7 signal components are degraded. In this manner, if the feedback signal contains the degraded IM7 signal components, it is difficult to accurately perform distortion compensation on IM7. As a consequence, the accuracy of distortion compensation is reduced.

On the other hand, in the known power amplification system, consideration is not given to the problem in the reduction of the accuracy of distortion compensation, the problem having been caused by that a part of IM is cut off by the analog filter included in the quadrature demodulator or DAC.

SUMMARY

According to an aspect of an embodiment, a distortion compensation apparatus that compensates nonlinear distortion of an amplifier that amplifies power of a multi-carrier signal includes a band limiting unit that places a first frequency band limitation on a first signal fed back from the amplifier to output a second signal after the first frequency band limitation, a decision unit that decides a first cutoff frequency of the first frequency band limitation based on a carrier interval of the multi-carrier signal, and an updating unit that updates a distortion compensation coefficient to be used for compensation of the nonlinear distortion, based on an error between the second signal and the multi-carrier signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
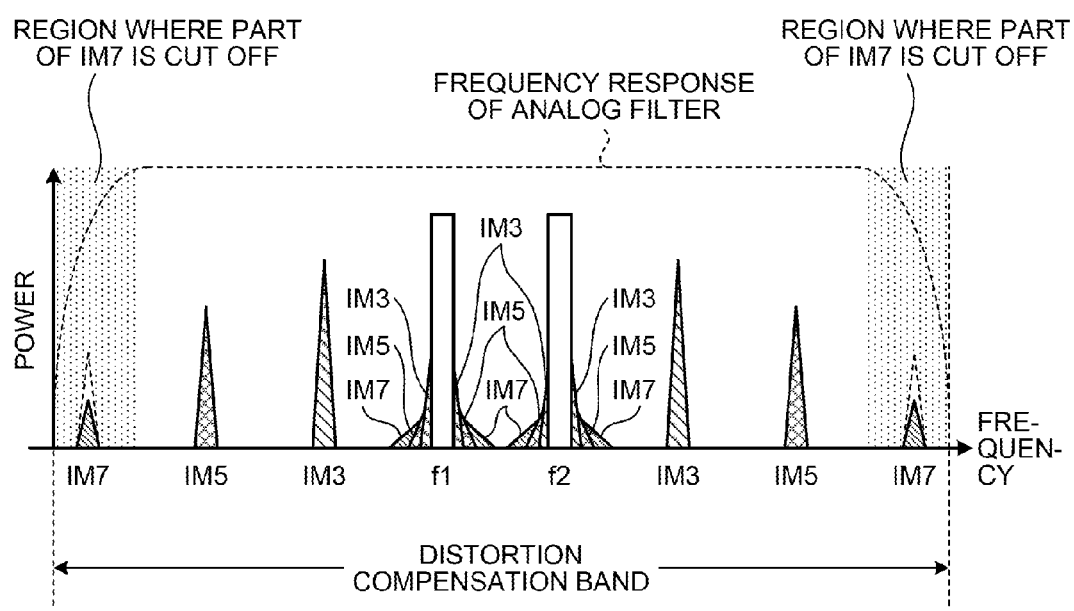
FIG. 1 is a diagram provided for the description of the problem.

Preferred embodiments of the present invention will be explained with reference to accompanying drawings. The distortion compensation apparatus, the wireless transmission apparatus, and the distortion compensation method, which are disclosed in the present application, are not limited by the embodiments. The same reference numerals are assigned to components having the same functions in the embodiments, and the overlapping descriptions are omitted.

[a] First Embodiment

Configuration Example of Wireless Transmission Apparatus

Figure 2:
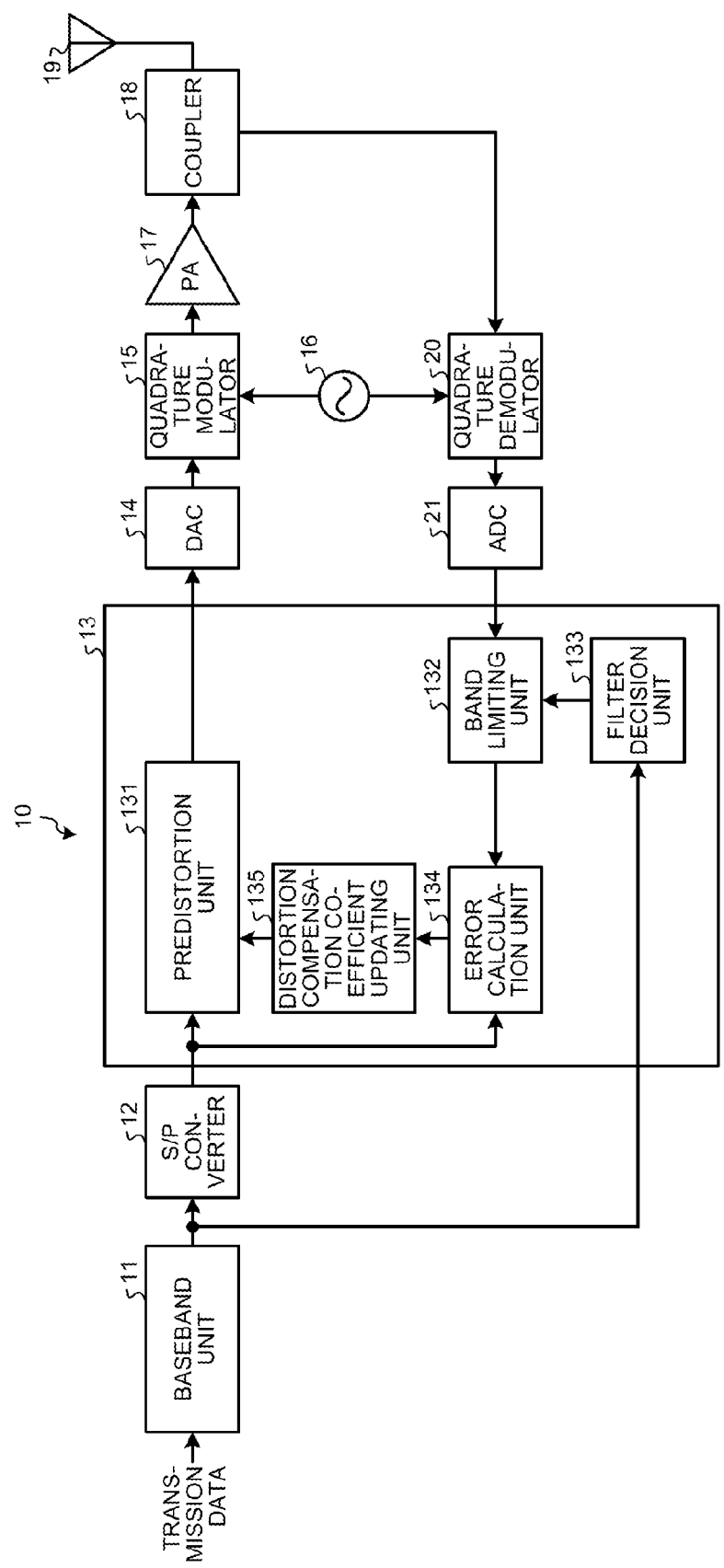
FIG. 2 is a block diagram illustrating a configuration example of a wireless transmission apparatus of a first embodiment.

FIG. 2 is a block diagram illustrating a configuration example of a wireless transmission apparatus of a first embodiment. In FIG. 2, a wireless transmission apparatus 10 includes a baseband unit 11, an S/P converter 12, a distortion compensation apparatus 13, a DAC 14, a quadrature modulator 15, a carrier wave generator 16, an amplifier (PA: Power Amplifier) 17, a coupler 18, and an antenna 19. Moreover, the wireless transmission apparatus 10 includes a quadrature demodulator 20 and an ADC 21. For example, the DAC 14 includes an LPF (Low-Pass Filter) being an analog filter to remove an image component generated by an interpolation process performed upon digital-to-analog conversion. Moreover, for example, the quadrature demodulator 20 includes an LPF being an analog filter to remove a folded component generated upon frequency conversion in the quadrature demodulator 20. The passbands of these LPFs are set according to the distortion compensation band.

Moreover, the distortion compensation apparatus 13 includes a predistortion unit 131, a band limiting unit 132, a filter decision unit 133, an error calculation unit 134, and a distortion compensation coefficient updating unit 135. The distortion compensation apparatus 13 is a PD type distortion compensation apparatus.

The wireless transmission apparatus 10 is mounted on, for example, a wireless communication terminal apparatus or wireless communication base station apparatus used in a wireless communication system.

The baseband unit 11 performs baseband processes such as a coding process and a modulation process on input transmission data, generates a baseband transmission signal, and outputs the generated transmission signal to the S/P converter 12 and the filter decision unit 133. Here, the baseband unit 11 generates a multi-carrier signal containing a plurality of signals at different frequencies from one another, as the baseband transmission signal.

The S/P converter 12 alternatingly splits the transmission signal input from the baseband unit 11, one bit by one bit, and converts the transmission signal into two series of an in-phase component (I component: In-Phase component) and a quadrature component (Q component: Quadrature component). The S/P converter 12 outputs the I and Q components in parallel to the predistortion unit 131 and the error calculation unit 134.

The predistortion unit 131 multiplies the distortion compensation coefficients sequentially updated by the distortion compensation coefficient updating unit 135, respectively, by the I and Q components, and generates predistortion signals (I and Q components). The predistortion unit 131 includes a table in which a plurality of distortion compensation coefficients is stored, reads, from the table, a distortion compensation coefficient according to the power of each of the I and Q components, and multiplies the distortion compensation coefficients by the I and Q components, respectively. The distortion compensation coefficients stored in the table are sequentially updated by the distortion compensation coefficient updating unit 135. The predistortion unit 131 outputs the generated predistortion signals to the DAC 14. In other words, the "predistortion signal" is a signal as a result of multiplying the baseband signal and the distortion compensation coefficient.

The DAC 14 converts the predistortion signals of both the I and Q components from digital into analog and outputs the analog predistortion signals to the quadrature modulator 15.

The carrier wave generator 16 generates a reference carrier wave, and outputs the generated reference carrier wave to the quadrature modulator 15 and the quadrature demodulator 20.

The quadrature modulator 15 multiplies the reference carrier wave by the I component out of the predistortion signals, and multiplies a carrier wave that is 90° out of phase with the reference carrier wave by the Q component out of the predistortion signals. The quadrature modulator 15 adds the multiplication results to quadrature-modulate and upconvert the predistortion signals and outputs the quadrature-modulated and upconverted predistortion signal to the amplifier 17.

The amplifier 17 amplifies the power of the predistortion signal input from the quadrature modulator 15 and outputs the power-amplified signal to the coupler 18.

The coupler 18 distributes the power-amplified signal to the antenna 19 and the quadrature demodulator 20. Consequently, the signal output from the amplifier 17 is fed back to the distortion compensation apparatus 13 via the quadrature demodulator 20 and the ADC 21.

The antenna 19 transmits the power-amplified signal.

The quadrature demodulator 20 multiplies each of the reference carrier wave generated by the carrier wave generator 16 and a carrier wave that is 90° out of phase with the reference carrier wave by the signal input from the coupler 18 to perform downconversion and quadrature demodulation. The quadrature demodulator 20 outputs, to the ADC 21, feedback signals of the I and Q components obtained by quadrature demodulation.

The ADC 21 converts the feedback signals from analog into digital and outputs the digital feedback signals to the band limiting unit 132.

The band limiting unit 132 includes a BPF (Band-Pass Filter) that can change the passband width, or a plurality of BPFs whose passband widths are different from one another. These BPFs are digital filters. The band limiting unit 132 uses the BPFs being digital filters to limit a frequency band of the feedback signals in accordance with the filter coefficients decided by the filter decision unit 133, and outputs the band-limited feedback signals to the error calculation unit 134.

The filter decision unit 133 monitors the multi-carrier signal input from the baseband unit 11, decides the filter coefficient in accordance with the monitoring result, and outputs the decided filter coefficient to the band limiting unit 132.

The processes in the band limiting unit 132 and the filter decision unit 133 are described in detail below.

The error calculation unit 134 calculates an error between the feedback signal band-limited in the band limiting unit 132 and the transmission signal input from the S/P converter 12, for both of the I and Q components, and outputs the calculated errors to the distortion compensation coefficient updating unit 135.

The distortion compensation coefficient updating unit 135 uses the LMS (Least Mean Square) algorithm or the like to sequentially update the distortion compensation coefficient stored in the predistortion unit 131 in such a manner as to minimize the error calculated in the error calculation unit 134 for both the I and Q components.

Operation of Distortion Compensation Apparatus

Figure 3:
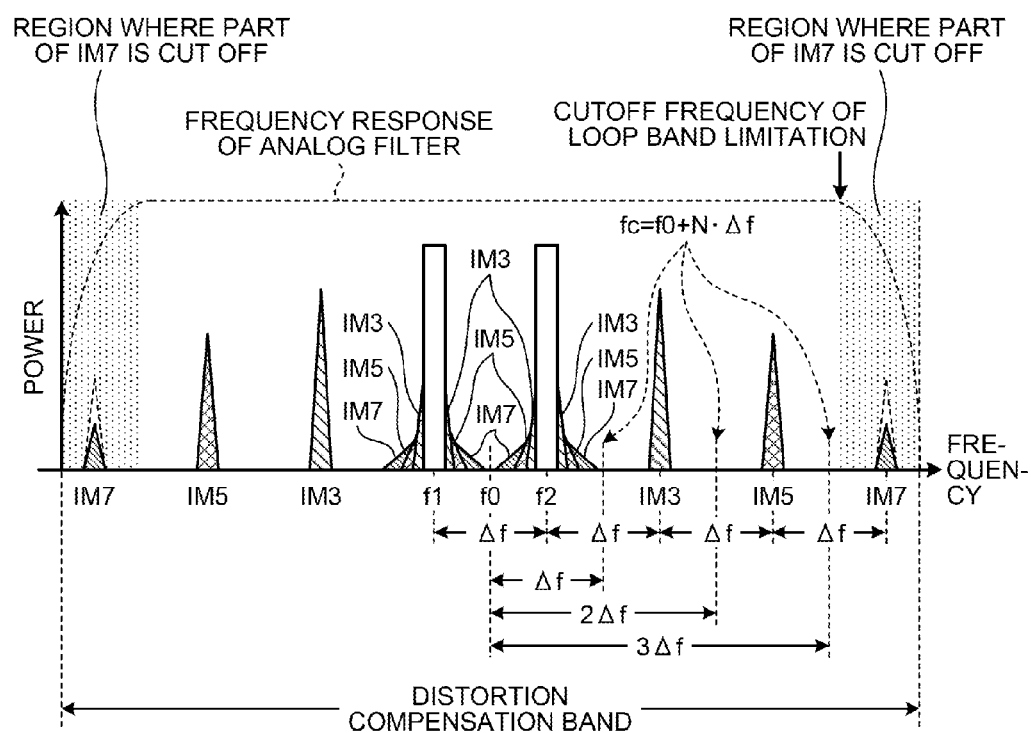
FIG. 3 is a diagram provided for the description of the operation of a distortion compensation apparatus of the first embodiment.

In the distortion compensation apparatus 13, the filter decision unit 133 and the band limiting unit 132 operate as follows to perform distortion compensation. FIG. 3 is a diagram provided for the description of the operation of the distortion compensation apparatus of the first embodiment.

As illustrated in FIG. 3, the multi-carrier signal being the transmission signal is assumed to contain the signal of the frequency f1 and the signal of the frequency f2. At this point in time, it is assumed that the frequency interval between the signal of the frequency f1 and the signal of the frequency f2, in other words, the carrier interval of the multi-carrier signal, is "$\Delta f = f2 - f1$." IM3, IM5, and IM7 respectively occur in $\Delta f$ intervals from the center frequency of the carrier. In other words, in a region equal to or more than the center frequency f0 of the multi-carrier signal, IM3 occurs at a position of $+\Delta f$, IM5 at a position of $+2\Delta f$, and IM7 at a position of $+3\Delta f$, with reference to the center frequency f2 of the carrier. Also in a region equal to or less than the center frequency f0 of the multi-carrier signal, IM3 occurs at a position of $-\Delta f$, IM5 at a position of $-2\Delta f$, and IM7 at a position of $-3\Delta f$, with reference to the center frequency f1 of the carrier. Moreover, IM3, IM5, and IM7 occur at both ends of the bottom of each of the carriers f1 and f2.

On the other hand, a part of IM7 lying in the regions at both ends of the distortion compensation band is cut off due to the band limitation by the analog LPF included in the DAC 14 or the quadrature demodulator 20. Hence, the feedback signal in which the part of IM7 has been cut off by the band limitation of the analog filter is input into the band limiting unit 132. Such a band limitation by the analog filter may be placed somewhere in a loop path from an input terminal of the DAC 14 to an output terminal of the ADC 21. Hence, the frequency band limitation placed by the analog filter in the loop path from the input terminal of the DAC 14 to the output terminal of the ADC 21 may be called the "loop band limitation" below.

Hence, the filter decision unit 133 decides a cutoff frequency fc of the band limitation placed in the band limiting unit 132 as the filter coefficient based on the carrier interval $\Delta f$ of the multi-carrier signal. For example, the filter decision unit 133 decides any of a plurality of frequencies at positions N times (N is an integer) the carrier interval $\Delta f$ with reference to the center frequency f0 of the multi-carrier signal, as the cutoff frequency fc of the BPF included in the band limiting unit 132. At this point in time, the filter decision unit 133 further decides a cutoff frequency of the LPF included in the DAC 14 or the quadrature demodulator 20, in other words, a frequency equal to or less than the cutoff frequency of the loop band limitation, as the cutoff frequency fc of the BPF included in the band limiting unit 132. In other words, the filter decision unit 133 decides any fc that satisfies the conditions of "$fc = f0 + N \cdot \Delta f$" and "$fc \leq$ the cutoff frequency of the loop band limitation," as the cutoff frequency of the band limitation in the band limiting unit 132. In FIG. 3, for example, it is preferred that the filter decision unit 133 decides a maximum frequency $f0 + 3\Delta f$ out of three frequencies of $f0 + \Delta f$, $f0 + 2\Delta f$, and $f0 + 3\Delta f$, which are equal to or less than the cutoff frequency of the loop band limitation, as the cutoff frequency fc. The filter decision unit 133 then instructs the band limiting unit 132 about the decided cutoff frequency fc.

The band limiting unit 132 places the band limitation on the input digital feedback signal, in accordance with the cutoff frequency fc instructed by the filter decision unit 133. For example, if the filter decision unit 133 has decided $f0 + 3\Delta f$ as the cutoff frequency fc, the band limiting unit 132 sets the passband of the BPF that can change the passband width to a band of $f0 \pm 3\Delta f$ with the frequency f0 as the center, and places the band limitation on the feedback signal. Moreover, in this case, for example, the band limiting unit 132 may place the band limitation by selecting the BPF whose passband is $f0 \pm 3\Delta f$ from three BPFs whose passbands are $f0 \pm \Delta f$, $f0 \pm 2\Delta f$, and $f0 \pm 3\Delta f$.

The BPFs included in the band limiting unit 132 are digital filters. Accordingly, the frequency response at the cutoff frequency fc is steep. Hence, if the cutoff frequency fc is $f0 + 3\Delta f$, it is possible to cut the whole of IM7 lying in the regions at both ends of the distortion compensation band by the band limitation in the band limiting unit 132. Consequently, the feedback signal will not at all contain IM7 lying in the regions at both ends of the distortion compensation band. Moreover, IM7 lying at the bottom of each of the signals of the frequencies f1 and f2 will not be influenced by the cutoff of the part of IM7 lying in both end regions of the distortion compensation band. Hence, it is possible to prevent the degradation of IM7 signal components contained in the feedback signal. On the other hand, the feedback signal contains all the IM7 signal components lying at the bottoms of the signals of the frequencies f1 and f2. Accordingly, the distortion compensation apparatus 13 can accurately perform distortion compensation on IM7. Hence, even if a part of IM is cut off by the loop band limitation, a reduction in the accuracy of distortion compensation can be prevented by including the filter decision unit 133 and the band limiting unit 132 in the distortion compensation apparatus 13.

As described above, according to the embodiment, the distortion compensation apparatus 13 is a distortion compensation apparatus that compensates the nonlinear distortion of the amplifier 17 that amplifiers the power of the multi-carrier signal, and includes the band limiting unit 132, the filter decision unit 133, and the distortion compensation coefficient updating unit 135. The band limiting unit 132 places the frequency band limitation on the feedback signal from the amplifier 17, and outputs the feedback signal after the frequency band limitation. The filter decision unit 133 decides the cutoff frequency fc of the frequency band limitation in the band limiting unit 132 based on the carrier interval $\Delta f$ of the multi-carrier signal. The distortion compensation coefficient updating unit 135 updates the distortion compensation coefficient used for the compensation of the nonlinear distortion of the amplifier 17, based on the error between the frequency band limited feedback signal and the multi-carrier signal.

More specifically, in the embodiment, the amplifier 17 amplifies the power of the multi-carrier signal converted from digital into analog by the DAC 14. The band limiting unit 132 places the frequency band limitation on the feedback signal converted from analog into digital by the ADC 21. The feedback signal to be input into the band limiting unit 132 is a signal after the frequency band limitation was placed in the path from the input terminal of the DAC 14 to the output terminal of the ADC 21, in other words, a signal after the loop band limitation was placed. The filter decision unit 133 decides any frequency equal to or less than the cutoff frequency of the loop band limitation among the frequencies at positions of an integer times of the carrier interval $\Delta f$ with reference to the center frequency f0 of the multi-carrier signal, as the cutoff frequency fc of the frequency band limitation in the band limiting unit 132. For example, the filter decision unit 133 decides any frequency out of f0+$\Delta f$, f0+2$\Delta f$, and f0+3$\Delta f$, as the cutoff frequency fc of the frequency band limitation in the band limiting unit 132.

Consequently, a frequency that can completely cut IM (for example, IM7) in which a part has been cut off by the loop band limitation and unwanted signal components remain can be decided as the cutoff frequency of the frequency band limitation in the band limiting unit 132. Hence, even if a part of IM has been cut off by the loop band limitation, a reduction in the accuracy of distortion compensation can be prevented.

Moreover, if the cutoff frequency fc is decided as described above, it is further preferred that the filter decision unit 133 decides, as the cutoff frequency fc, a maximum frequency among frequencies equal to or less than the cut off frequency of the loop band limitation.

Consequently, it is possible to cut only IM (for example, IM7) in which a part has been cut off by the loop band limitation while leaving IMs (for example, IM3 and IM5) that are not influenced by the loop band limitation. Hence, the correct IM signal components can be maximized after IM with an unwanted signal component is completely cut off. Accordingly, the accuracy of distortion compensation can be improved.

[b] Second Embodiment

The embodiment is different from the first embodiment in the point that the cutoff frequency fc decided as in the first embodiment is adjusted based on the error calculated by the error calculation unit 134.

Figure 4:
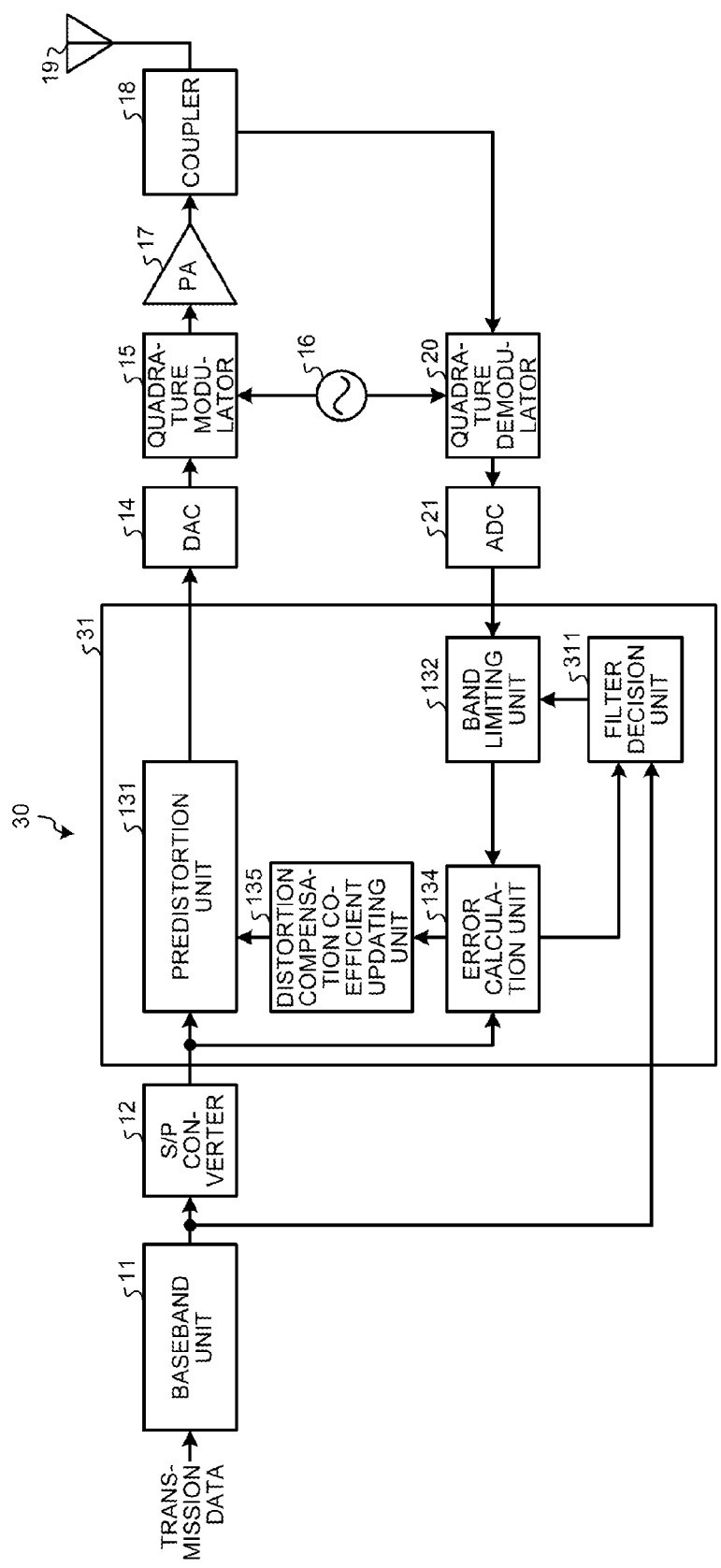
FIG. 4 is a block diagram illustrating a configuration example of a wireless transmission apparatus of a second embodiment.

FIG. 4 is a block diagram illustrating a configuration example of a wireless transmission apparatus of the second embodiment. In a wireless transmission apparatus 30 illustrated in FIG. 4, a distortion compensation apparatus 31 includes a filter decision unit 311.

The multi-carrier signal generated by the baseband unit 11 is input into the filter decision unit 311. Moreover, the error calculated by the error calculation unit 134 is input into the filter decision unit 311. Firstly, the filter decision unit 311 decides the cutoff frequency fc as in the first embodiment. Next, the filter decision unit 311 adjusts the decided cutoff frequency fc based on the error calculated by the error calculation unit 134. For example, the filter decision unit 311 uses the LMS algorithm or the like and adjusts the cutoff frequency fc in such a manner as to minimize an error to be calculated by the error calculation unit 134. As described above, the distortion compensation coefficient is sequentially updated in such a manner as to minimize an error to be calculated by the error calculation unit 134. Hence, the accuracy of distortion compensation can be improved by adjusting the cutoff frequency fc in such a manner as to minimize the error.

Here, the update of the distortion compensation coefficient by the distortion compensation coefficient updating unit 135 and the adjustment of the cutoff frequency fc by the filter decision unit 311 are alternatingly performed. In other words, in the distortion compensation apparatus 31, firstly, the filter decision unit 311 decides the cutoff frequency fc as in the first embodiment. The distortion compensation coefficient is updated for a fixed time period using the feedback signal band-limited in accordance with the decided cutoff frequency fc. Next, the filter decision unit 311 monitors the error after a lapse of the fixed time period, and adjusts the cutoff frequency fc. The feedback signal band-limited in accordance with the adjusted cutoff frequency fc is used to update the distortion compensation coefficient for another fixed time period. From then on, the update of the distortion compensation coefficient performed for the fixed time period and the adjustment of the cutoff frequency fc made after every lapse of the fixed time period are alternatingly repeated.

The filter decision unit 311 may perform the integral process or averaging process on the errors to improve the accuracy of monitoring upon error monitoring.

As described above, according to the embodiment, in the distortion compensation apparatus 31, the filter decision unit 311 adjusts the cutoff frequency fc decided as in the first embodiment based on the error calculated by the error calculation unit 134. Consequently, the accuracy of distortion compensation can be further improved than the first embodiment.

[c] Third Embodiment

The embodiment is different from the first embodiment in the point that any of a plurality of frequencies of f0+N·$\Delta f$ equal to or less than the cutoff frequency of the loop band limitation is decided as the cutoff frequency fc based on the error calculated by the error calculation unit 134.

A configuration example of a wireless transmission apparatus of the embodiment is similar to that of the second embodiment. Accordingly, the operation of the embodiment is described below, using FIG. 4.

The multi-carrier signal generated by the baseband unit 11 is input into the filter decision unit 311. Moreover, the error calculated by the error calculation unit 134 is input into the filter decision unit 311. Firstly, the filter decision unit 311 specifies a plurality of frequencies lying at f0+N·$\Delta f$ in the region equal to or less than the cutoff frequency of the loop band limitation. For example, the filter decision unit 311 specifies three frequencies of f0+$\Delta f$, f0+2$\Delta f$, and f0+3$\Delta f$, which are illustrated in FIG. 3. The filter decision unit 311 then decides a frequency to minimize an error to be calculated by the error calculation unit 134 out of the three frequencies as the cutoff frequency fc of the band limitation in the band limiting unit 132.

In other words, firstly, the filter decision unit 311 monitors a first error of when the cutoff frequency fc is set to f0+Δf. Next, the filter decision unit 311 monitors a second error of when the cutoff frequency fc is set to f0+2Δf. Next, the filter decision unit 311 monitors a third error of when the cutoff frequency fc is set to f0+3Δf. The filter decision unit 311 then selects the cutoff frequency fc corresponding to a minimum error from the first to third errors.

The filter decision unit 311 may perform the integral process or averaging process on the errors to improve the accuracy of monitoring upon error monitoring, as in the second embodiment.

As described above, according to the embodiment, in the distortion compensation apparatus 31, the filter decision unit 311 decides, as the cutoff frequency fc, any of the plurality of frequencies equal to or less than the cutoff frequency of the loop band limitation and lying at f0+N·Δf. At this point in time, the filter decision unit 311 decides any of the plurality of frequencies lying at f0+N·Δf as the cutoff frequency fc based on the errors calculated by the error calculation unit 134. Consequently, the accuracy of distortion compensation can be further improved than the first embodiment.

[d] Fourth Embodiment

The embodiment is different from the first embodiment in the point that the cutoff frequency fc decided as in the first embodiment is adjusted based on the amount of distortion of the feedback signal.

Figure 5:
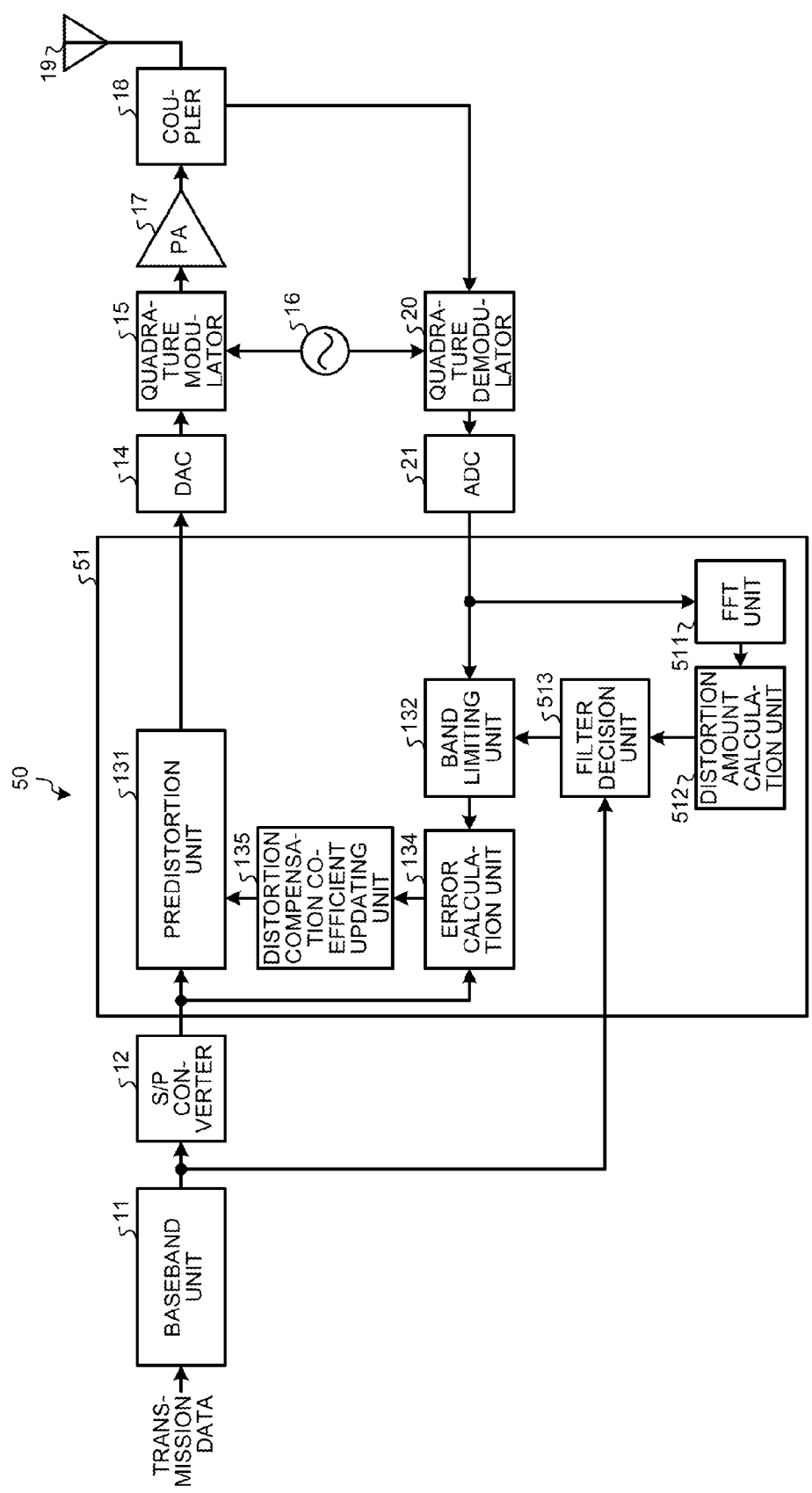
FIG. 5 is a block diagram illustrating a configuration example of a wireless transmission apparatus of a fourth embodiment.

FIG. 5 is a block diagram illustrating a configuration example of a wireless transmission apparatus of the fourth embodiment. In a wireless transmission apparatus 50 illustrated in FIG. 5, a distortion compensation apparatus 51 includes an FFT (Fast Fourier Transform) unit 511, a distortion amount calculation unit 512, and a filter decision unit 513.

The digital feedback signal is input from the ADC 21 into the FFT unit 511. The FFT unit 511 converts the feedback signal from a time-domain signal into a frequency-domain signal, and outputs the frequency-domain feedback signal to the distortion amount calculation unit 512.

The distortion amount calculation unit 512 calculates the amount of distortion of the frequency-domain feedback signal. For example, the distortion amount calculation unit 512 may calculate an adjacent channel leakage ratio (ACLR), the power value of IM, or the like, as the amount of distortion. The distortion amount calculation unit 512 outputs the calculated amount of distortion to the filter decision unit 513.

The multi-carrier signal generated by the baseband unit 11 is input into the filter decision unit 513. Firstly, the filter decision unit 513 then decides the cutoff frequency fc as in the first embodiment. Next, the filter decision unit 513 adjusts the decided cutoff frequency fc based on the amount of distortion calculated by the distortion amount calculation unit 512. For example, the filter decision unit 513 uses the LMS algorithm or the like and adjusts the cutoff frequency fc in such a manner as to minimize the amount of distortion to be calculated by the distortion amount calculation unit 512.

Here, the update of the distortion compensation coefficient by the distortion compensation coefficient updating unit 135 and the adjustment of the cutoff frequency fc by the filter decision unit 513 are alternatingly performed. In other words, in the distortion compensation apparatus 51, firstly, the filter decision unit 513 decides the cutoff frequency fc as in the first embodiment. The distortion compensation coefficient is updated for a fixed time period using the feedback signal band-limited in accordance with the decided cutoff frequency fc. Next, the filter decision unit 513 monitors the amount of distortion after a lapse of the fixed time period, and adjusts the cutoff frequency fc. The feedback signal band-limited in accordance with the adjusted cutoff frequency fc is used to update the distortion compensation coefficient for another fixed time period. From then on, the update of the distortion compensation coefficient performed for the fixed time period and the adjustment of the cutoff frequency fc made after every lapse of the fixed time period are alternatingly repeated.

The filter decision unit 513 may perform the integral process or averaging process on the amounts of distortion to improve the accuracy of monitoring upon monitoring the amount of distortion.

As described above, according to the embodiment, in the distortion compensation apparatus 51, the filter decision unit 513 adjusts the cutoff frequency fc decided as in the first embodiment, based on the amount of distortion of the feedback signal. Consequently, the accuracy of distortion compensation can be further improved than the first embodiment.

[e] Fifth Embodiment

The embodiment is different from the first embodiment in the point that any of a plurality of frequencies of f0+N·Δf equal to or less than the cutoff frequency of the loop band limitation is decided as the cutoff frequency fc based on the amount of distortion of the feedback signal.

A configuration example of a wireless transmission apparatus of the embodiment is similar to that of the fourth embodiment. Accordingly, the operation of the embodiment is described below, using FIG. 5.

The multi-carrier signal generated by the baseband unit 11 is input into the filter decision unit 513. Moreover, the amount of distortion calculated by the distortion amount calculation unit 512 is input into the filter decision unit 513. Firstly, the filter decision unit 513 specifies a plurality of frequencies lying at f0+N·Δf in the region equal to or less than the cutoff frequency of the loop band limitation. For example, the filter decision unit 513 specifies three frequencies of f0+Δf, f0+2Δf, and f0+3Δf, which are illustrated in FIG. 3. The filter decision unit 513 then decides a frequency to minimize the amount of distortion to be calculated by the distortion amount calculation unit 512 out of the three frequencies, as the cutoff frequency fc of the band limitation in the band limiting unit 132.

In other words, firstly, the filter decision unit 513 monitors a first amount of distortion of when the cutoff frequency fc is set to f0+Δf. Next, the filter decision unit 513 monitors a second amount of distortion of when the cutoff frequency fc is set to f0+2Δf. Next, the filter decision unit 513 monitors a third amount of distortion of when the cutoff frequency fc is set to f0+3Δf. The filter decision unit 513 then selects the cutoff frequency fc corresponding to a minimum amount of distortion from the first to third amounts of distortion.

The filter decision unit 513 may perform the integral process or averaging process on the amounts of distortion to improve the accuracy of monitoring upon monitoring the amount of distortion, as in the fourth embodiment.

As described above, according to the embodiment, in the distortion compensation apparatus 51, the filter decision unit 513 decides any of the plurality of frequencies equal to or less than the cutoff frequency of the loop band limitation and lying at f0+N·Δf, as the cutoff frequency fc. At this point in time, the filter decision unit 513 decides any of the plurality of frequencies lying at f0+N·Δf as the cutoff frequency fc based on the amounts of distortion calculated by the distortion amount calculation unit 512. Consequently, the accuracy of distortion compensation can be further improved than the first embodiment.

[f] Sixth Embodiment

If the carrier interval of the multi-carrier signal being the transmission signal changes, the positions where IMs occur also change. Hence, the embodiment is different from the first embodiment in the point that the cutoff frequency fc is changed when the carrier interval of the multi-carrier signal changes.

Figure 6:
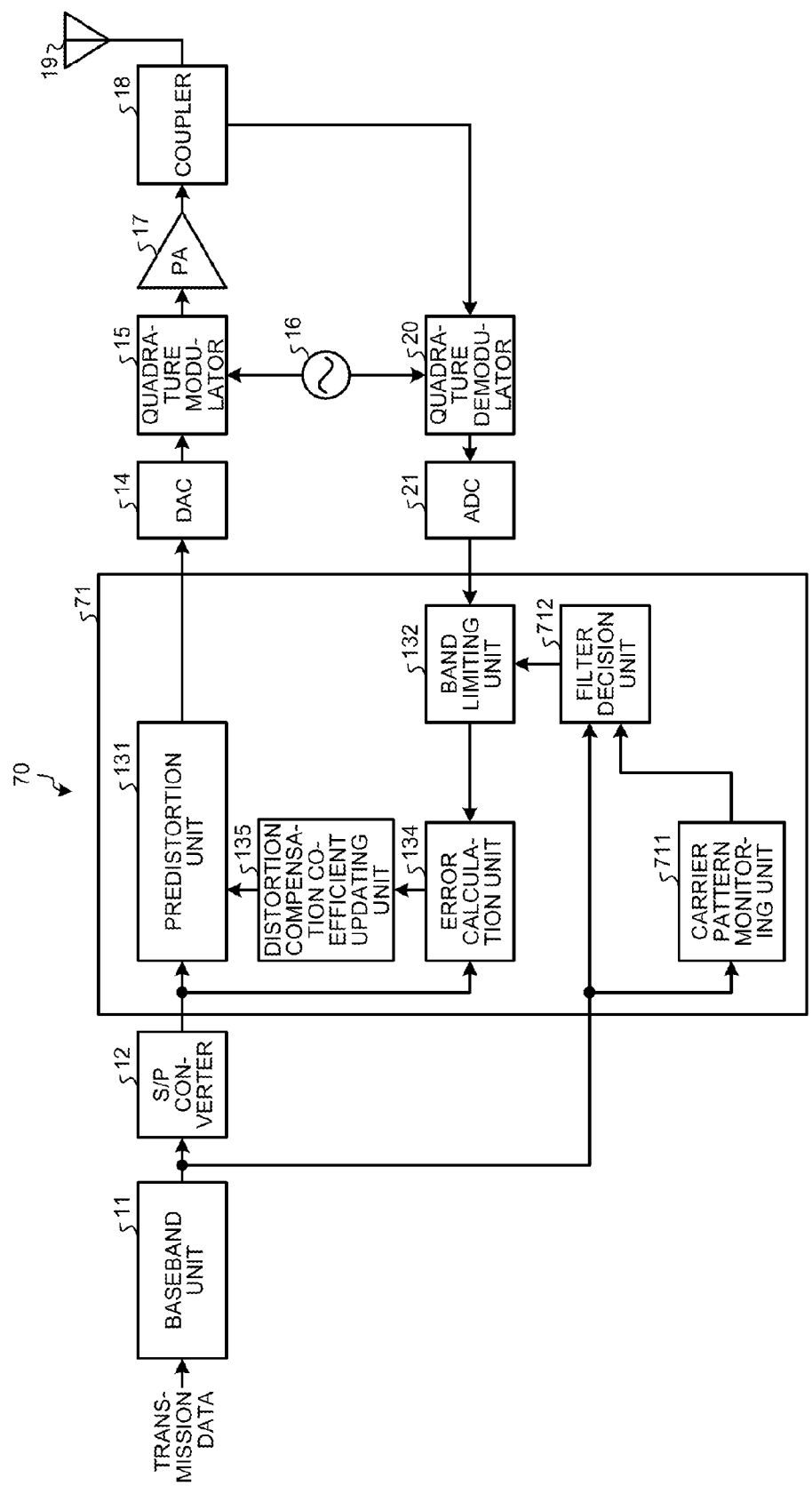
FIG. 6 is a block diagram illustrating a configuration example of a wireless transmission apparatus of a sixth embodiment.

FIG. 6 is a block diagram illustrating a configuration example of a wireless transmission apparatus of the sixth embodiment. In a wireless transmission apparatus 70 illustrated in FIG. 6, a distortion compensation apparatus 71 includes a carrier pattern monitoring unit 711 and a filter decision unit 712.

The multi-carrier signal generated by the baseband unit 11 is input into the carrier pattern monitoring unit 711. The carrier pattern monitoring unit 711 monitors the carrier interval Δf of the multi-carrier signal as the carrier pattern of the multi-carrier signal. When the carrier interval Δf changes, the carrier pattern monitoring unit 711 outputs an enable signal to the filter decision unit 712.

The multi-carrier signal generated by the baseband unit 11 is input into the filter decision unit 712. At a timing when the enable signal is input from the carrier pattern monitoring unit 711, the filter decision unit 712 decides a new cutoff frequency fc based on the changed carrier interval Δf, and changes the cutoff frequency fc as in the first embodiment.

As described above, according to the embodiment, in the distortion compensation apparatus 71, the filter decision unit 712 changes the cutoff frequency fc when the carrier interval Δf of the multi-carrier signal changes. Consequently, an optimum cutoff frequency fc is decided in accordance with the change of the carrier interval Δf. Accordingly, even if the carrier interval Δf changes, a reduction in the accuracy of distortion compensation can be prevented.

Up to this point, the first to sixth embodiments have been described.

[g] Other Embodiments

The distortion compensation apparatuses 13, 31, 51, and 71 are realized as hardware by, for example, FPGAs (Field Programmable Gate Array), LSIs (Large Scale Integrated circuit), or processors. Furthermore, the baseband unit 11 and the S/P converter 12 are also realized as hardware by FPGAs, LSIs, processors, or the like. Examples of the processor include a CPU (Central Processing Unit) and DSP (digital Signal Processor). Moreover, the DAC 14, the quadrature modulator 15, the carrier wave generator 16, the amplifier 17, the coupler 18, the antenna 19, the quadrature demodulator 20, and the ADC 21 are realized as hardware by wireless communication modules. Moreover, the wireless transmission apparatuses 10, 30, 50, and 70 and the distortion compensation apparatuses 13, 31, 51, and 71 may include a memory. For example, a table in which distortion compensation coefficients are stored is stored in the memory.

According to the aspect of the disclosure, a reduction in the accuracy of distortion compensation can be prevented.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation apparatus that compensates nonlinear distortion of an amplifier that amplifies power of a multi-carrier signal, the distortion compensation apparatus comprising:
   a band limiting unit that places a first frequency band limitation on a first signal fed back from the amplifier to output a second signal after the first frequency band limitation;
   a decision unit that decides a first cutoff frequency of the first frequency band limitation based on a carrier interval of the multi-carrier signal; and
   an updating unit that updates a distortion compensation coefficient to be used for compensation of the nonlinear distortion, based on an error between the second signal and the multi-carrier signal.

2. The distortion compensation apparatus according to claim 1, wherein
   the amplifier amplifies the power of the multi-carrier signal converted from digital into analog by a digital-to-analog converter,
   the band limiting unit places the first frequency band limitation on the first signal converted from analog into digital by an analog-to-digital converter,
   the first signal is a signal after a second frequency band limitation was placed in a path from an input terminal of the digital-to-analog converter to an output terminal of the analog-to-digital converter, and
   the decision unit decides, as the first cutoff frequency, any frequency equal to or less than a second cutoff frequency of the second frequency band limitation, among frequencies lying at positions of an integer times of the carrier interval with reference to a center frequency of the multi-carrier signal.

3. The distortion compensation apparatus according to claim 2, wherein the decision unit decides a maximum frequency among the frequencies equal to or less than the second cutoff frequency as the first cutoff frequency.

4. The distortion compensation apparatus according to claim 1, wherein the decision unit adjusts the decided first cutoff frequency based on the error.

5. The distortion compensation apparatus according to claim 1, wherein the decision unit adjusts the decided first cutoff frequency based on an amount of distortion of the first signal.

6. The distortion compensation apparatus according to claim 2, wherein the decision unit decides, as the first cutoff frequency, one of a plurality of frequencies equal to or less than the second cutoff frequency and lying at the positions of the integer times of the carrier interval, based on the error.

7. The distortion compensation apparatus according to claim 2, wherein the decision unit decides, as the first cutoff frequency, one of a plurality of frequencies equal to or less the second cutoff frequency and lying at the positions of the integer times of the carrier interval, based on an amount of distortion of the first signal.

8. The distortion compensation apparatus according to claim 1, wherein the decision unit changes the first cutoff frequency upon change of the carrier interval.

9. A wireless transmission apparatus comprising:
a digital-to-analog converter that converts a digital multi-carrier signal into an analog multi-carrier signal;
an amplifier that amplifies power of the analog multi-carrier signal;
an analog-to-digital converter that converts an analog first signal fed back from the amplifier into a digital first signal;
a band limiting unit that places a first frequency band limitation on the digital first signal to output a second signal after the first frequency band limitation;
a decision unit that decides a first cutoff frequency of the first frequency band limitation based on a carrier interval of the digital multi-carrier signal; and
an updating unit that updates a distortion compensation coefficient to be used for compensation of nonlinear distortion of the amplifier, based on an error between the second signal and the digital multi-carrier signal.

10. The wireless transmission apparatus according to claim 9, wherein
the analog first signal is a signal after a second frequency band limitation was placed in a path from an input terminal of the digital-to-analog converter to an output terminal of the analog-to-digital converter, and
the decision unit decides, as the first cutoff frequency, any frequency equal to or less than a second cutoff frequency of the second frequency band limitation, among frequencies lying at positions of an integer times of the carrier interval with reference to a center frequency of the digital multi-carrier signal.

11. A distortion compensation method for compensating nonlinear distortion of an amplifier that amplifies power of a multi-carrier signal, the distortion compensation method comprising:
deciding a cutoff frequency of a frequency band limitation to be placed on a first signal fed back from the amplifier, based on a carrier interval of the multi-carrier signal;
placing the frequency band limitation on the first signal in accordance with the cutoff frequency to acquire a second signal after the frequency band limitation; and
updating a distortion compensation coefficient to be used for compensation of the nonlinear distortion, based on an error between the second signal and the multi-carrier signal.

* * * * *